(12) United States Patent
Chaudhry et al.

(10) Patent No.: US 8,493,122 B1
(45) Date of Patent: Jul. 23, 2013

(54) VOLTAGE CLAMPING CIRCUIT

(75) Inventors: Nidhi Chaudhry, Ghaziabad (IN); Parul K. Sharma, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 33 days.

(21) Appl. No.: 13/410,267

(22) Filed: Mar. 1, 2012

(51) Int. Cl.
*H03K 5/08* (2006.01)

(52) U.S. Cl.
USPC .......... 327/318; 327/319; 327/320; 327/321; 327/327; 327/328

(58) Field of Classification Search
USPC .................................. 327/318–321, 327, 328
See application file for complete search history.

(56) References Cited

U.S. PATENT DOCUMENTS

| | | | |
|---|---|---|---|
| 4,525,637 A | 6/1985 | Sano | |
| 5,561,391 A | 10/1996 | Wellnitz | |
| 5,847,591 A | 12/1998 | Schnell | |
| 7,138,847 B2 * | 11/2006 | Ajit | 327/313 |
| 7,254,003 B2 | 8/2007 | Lau | |
| 7,518,352 B2 | 4/2009 | De Lima | |
| 7,532,445 B2 | 5/2009 | Rana | |
| 7,733,159 B1 * | 6/2010 | Camarota et al. | 327/534 |
| 8,111,047 B2 | 2/2012 | Betty | |

OTHER PUBLICATIONS

Chand, Jagdish, et al., "High Voltage Protection for USB Transceivers in 45nm CMOS" Circuits and Systems (ISCAS), IEEE International Symposium, 2011.

* cited by examiner

*Primary Examiner* — Kenneth B. Wells
(74) *Attorney, Agent, or Firm* — Charles Bergere

(57) ABSTRACT

A voltage clamping circuit for protecting an input/output (I/O) terminal of an integrated circuit from over shoot and under shoot voltages includes transistors connected to form a current conducting path. A voltage at the I/O pin is detected using a voltage detection circuit. The current conducting path is switched on when the voltage at the I/O pin exceeds a predetermined value.

20 Claims, 2 Drawing Sheets

VOLTAGE CLAMPING CIRCUIT

BACKGROUND OF THE INVENTION

The present invention generally relates to voltage clamping circuits, and, more particularly, to voltage clamping circuits that include active low voltage devices.

Input/output (I/O) circuits are used to input and output electrical signals to and from integrated circuits (ICs) and are usually coupled to one or more I/O pins of an IC. I/O pins receive signals from external circuits and pass the received input signals to the corresponding I/O circuits. The I/O circuits pass the input signals to internal circuitry of the IC. The I/O circuits also transmit output signals received from the IC internal circuitry to the I/O pins, which in turn transmit these output signals to external circuits. Due to shrinking dimensions of ICs, among other reasons, IC supply voltages have been continuously declining, which necessitates use of low voltage (~1.8V) devices, such as low-voltage transistors, in the I/O circuits.

However, such low voltage devices may be less reliable. For example, an I/O pin may be subjected to reflections, voltage over shoots, and voltage under shoots during data transmission, resulting in voltage spikes of about 1.0 volt above the I/O supply voltage and 1.0 volt below the I/O ground. Such voltage spikes can lead to failure of low voltage devices. When a circuit drives a data packet to an I/O circuit, the I/O circuit may exhibit poor performance if it is unpowered or under powered. Further, transistors in I/O circuits are susceptible to failure during pull-up transactions on the I/O pin. Specific compliance tests, such as Universal Serial Bus (USB) A/C stress test, may subject the transistors to voltages beyond their operating limits, causing them to fail. Thus, I/O circuits need to be protected from over shoot and under shoot voltages.

FIG. 1 shows a conventional I/O protection circuit 100 used for protecting an I/O circuit from over shoot and under shoot voltages. The I/O protection circuit 100 includes a plurality of constant-current diodes including first through fourth diodes 102a-102d (referred to collectively as 102), and an I/O pin 104. The four diodes 102 are connected in series, with a second terminal of the first diode 102a receiving a supply voltage $V_{DDH}$, a first terminal of the fourth diode 102d connected to ground, and the I/O pin 104 coupled to a node between the second and third diodes 102b and 102c. The I/O pin 104 is connected to an I/O circuit (not shown) and transmits electrical signals received from an external circuit to the I/O circuit. The I/O circuit also is connected to an IC (not shown) and receives electrical signals transmitted from the IC to the I/O pin 104. When the I/O pin 104 is subjected to a voltage greater than twice the threshold voltage ($V_t$) of the diodes 102, a low-resistance path is enabled from the I/O pin 104 to the supply voltage terminal $V_{DDH}$ through the first and second diodes 102a and 102b. When the I/O pin 104 is subjected to a voltage that is less than twice $V_t$, a low-resistance path is enabled from ground through the third and fourth diodes 102c and 102d, to the I/O pin 104. The low-resistance path absorbs the over shoot or under shoot voltages and provides a clamped over shoot voltage having a magnitude of ($V_{DDH}+2V_t$) and a clamped under shoot voltage having a magnitude of ($-2V_t$). However, the constant clamped magnitudes may exceed the reliability limits of the I/O circuit and the I/O protection circuit 100 may not protect the I/O circuit. Additionally, the magnitude of the output clamping voltage is dependent on the design technology of the I/O protection circuit 100.

Therefore, it would be advantageous to have a voltage clamping circuit that provides controlled lower clamped voltage and higher clamped current and that overcomes the above-mentioned limitations of existing voltage clamping circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

Various embodiments of the present invention provide a voltage clamping circuit for protecting an I/O circuit connected to an I/O pin from overshoot and undershoot voltages. The voltage clamping circuit includes a first transistor that receives a voltage at the I/O pin at a drain terminal and a first voltage at a gate terminal. A source terminal of the first transistor is connected to a drain terminal of a second transistor and a source terminal of the second transistor is provided with a second voltage. A voltage at a node between the source and drain terminals of the first and second transistors, respectively, is sensed by a voltage detection circuit. The voltage detection circuit provides an output signal that is generated based on the voltage sensed at the node to a gate terminal of the second transistor. The output signal switches on the second transistor when the voltage at the node exceeds a first predetermined threshold. Since the voltage at the node follows the voltage at the I/O pin, whenever the voltage at the I/O pin increases beyond the first predetermined threshold, the second transistor is switched on and a current path is established from the I/O pin to the source terminal (which is connected to a supply voltage terminal) of the second transistor. This clamps the voltage at the I/O pin at the first predetermined threshold. As a result, the I/O circuit is protected from overshoot voltages by the voltage clamping circuit.

A third transistor is connected between the I/O pin and the source terminal of the first transistor such that the gate of the third transistor receives the voltage at the I/O pin. The third transistor is switched on to protect the first transistor from the voltage at the I/O pin. Thus, the voltage clamping circuit provides a self-protection mechanism in addition to regular clamping of voltage at the I/O pin.

In another embodiment, the voltage clamping circuit is used to protect the I/O pin from undershoot voltages. Undershoot voltage protection includes establishing a current conducting path from the ground to the I/O pin (similar to the overshoot voltage protection) when the voltage at the I/O pin drops below a second predetermined threshold. Thus, the voltage clamping circuit clamps the voltage at the I/O pin and protects the I/O pin from overshoot and undershoot voltages. The clamping voltages are independent of the technology of the clamping circuit and can be controlled during design of the circuit.

Figures 1, 2:
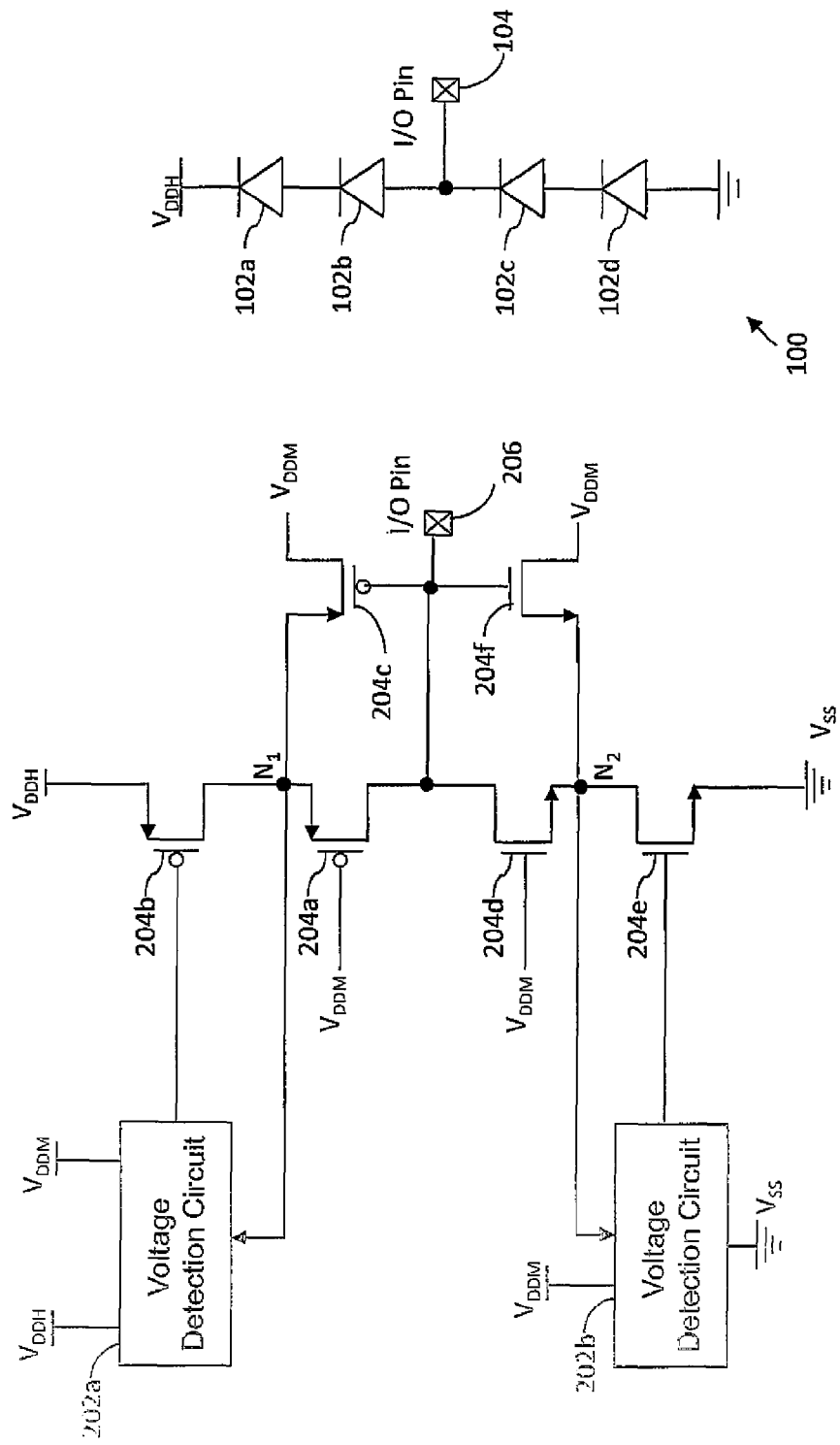
FIG. 1 is a conventional system for protecting an I/O circuit from overshoot and undershoot voltages.
FIG. 2 is a schematic diagram of a voltage clamping circuit in accordance with an embodiment of the present invention.

Referring now to FIG. 2, a schematic diagram of a voltage clamping circuit 200 in accordance with an embodiment of the present invention is shown. The voltage clamping circuit 200 includes first and second voltage detection circuits 202a and 202b, a plurality of transistors including first through sixth transistors 204a-204f, and an I/O pin 206.

The I/O pin 206 is connected to gate terminals of the third and sixth transistors 204c and 204f, and to the drain terminals of the first and fourth transistors 204a and 204d. Additionally, the I/O pin 206 is connected to an I/O circuit (not shown) that includes one or more low-voltage electronic devices. Source terminals of the third and sixth transistors 204c and 204f are connected to source terminals of the first and fourth transistors 204a and 204d, respectively, at first and second nodes N1 and N2. Drain terminals of the third and sixth transistors 204c and 204f are connected to a supply voltage $V_{DDM}$; and gate terminals of the first and fourth transistors 204a and 204d also are connected to the supply voltage $V_{DDM}$. In an embodiment of the present invention, the first, second, and third transistors 204a and 204c are p-channel metal-oxide semiconductor (PMOS) transistors and the fourth, fifth, and sixth transistors 204d and 204f are n-channel metal-oxide semiconductor (NMOS) transistors. In another embodiment, the first, second, and third transistors 204a, 204b and 204c are PNP BJTs, and the fourth, fifth and sixth transistors 204d, 204e, 204f are NPN BJTs.

The source terminal of the first transistor 204a is connected to the first voltage detection circuit 202a and to a drain terminal of the second transistor 204b at the first node N1. Similarly, the source terminal of the fourth transistor 204d is connected to the second voltage detection circuit 202b and to a drain terminal of the fifth transistor 204e at the second node N1. A source terminal of the second transistor 204b is connected to a supply voltage $V_{DDR}$, and a source terminal of the fifth transistor 204e is connected to ground.

The first voltage detection circuit 202a is provided with supply voltages of $V_{DDH}$ and $V_{DDM}$ and is connected to a gate terminal of the second transistor 204b. The second voltage detection circuit 202b is provided with the supply voltage $V_{DDM}$ and is connected to a gate terminal of the fifth transistor 204e.

The I/O pin 206 transmits and receives I/O signals to and from the I/O circuit (not shown). In an embodiment of the present invention, $V_{DDH}$ is basically the I/O supply voltage, e.g., in USB protocol $V_{DDH}$ is 3.3V, and the voltage $V_{DDM}$ is less than the voltage $V_{DDH}$ with Vddm being an intermediate voltage used as protection voltage. In an embodiment of the invention, $V_{DDM}$ is equal to the voltage rating of the devices used in the circuit, e.g., 1.8V if the device voltage rating is 1.8V.

The nominal range of the voltage applied to the I/O pin 206 is from 0V to $V_{DDH}$. When a voltage at the I/O pin 206 is in a nominal range, e.g., less than $V_{DDM}$ and greater than 0V, the third transistor 204c is switched on. This results in voltage $V_{DDM}$ being applied to the source terminal of the first transistor 204a at the first node N1. Since voltage $V_{DDM}$ is also applied to the gate terminal of the first transistor 204a, the first transistor 204a enters the deep cut-off region, which leads to protection of the first transistor 204a when the voltage at the I/O pin 206 is in the nominal range.

When the voltage at the I/O pin 206 exceeds $V_{DDM}$, the third transistor 204c is switched off and the first transistor 204a is switched on. As a result, voltage at the first node N1 begins to follow the voltage at the drain terminal of the transistor 204a, i.e. voltage at first node N1 becomes equal to voltage at the I/O pin 206 minus the threshold voltage $V_{T1}$ of the first transistor 204a. In this case, when the voltage at the I/O pin is less than $V_{DDH}$, the first voltage detection circuit 202a detects the voltage at the node N1 and provides the voltage $V_{DDH}$ to the gate terminal of the second transistor 204b.

The second transistor 204b remains switched off when the voltage at the I/O pin 206 is less than $V_{DDH}$. When the voltage at the I/O pin 206 exceeds ($V_{DDH}+V_{T1}$), the voltage detection circuit 202a provides voltage $V_{DDM}$ to the gate terminal of the second transistor 204b. A detailed description of detection and generation of voltages of different magnitudes by the first voltage detection circuit 202a is provided below in conjunction with FIG. 3A. Since the gate voltage of the second transistor 204b is reduced from $V_{DDH}$ to $V_{DDM}$, and the source voltage is $V_{DDH}$, the second transistor 204b is switched on. Since both the first and second transistors 204a and 204b are switched on, a current conducting path is formed from the I/O pin 206 to a supply terminal ($V_{DDH}$) connected to the source terminal of the second transistor 204b when the voltage at the I/O pin 206 exceeds $V_{DDH}$. Thus, the voltage at the first node N1 and the I/O pin 206 are clamped to the supply voltage $V_{DDH}$ and the low-voltage electronic devices of the I/O circuit are protected from damage due to voltage overshoots.

As described above, the I/O pin 206 is protected from voltage overshoots by the first through third transistors 102a and the first voltage detection circuit 202a. Similarly, as discussed in detail below, the I/O pin 206 is protected from voltage undershoots by the fourth, fifth and sixth transistors 204d, 204e and 204f, and the second voltage detection circuit 202b.

When the voltage at the I/O pin 206 is greater than $V_{DDM}$, the sixth transistor 204f is switched on and the voltage $V_{DDM}$ appears at the source of the fourth transistor 204d (node N2). The voltage $V_{DDM}$ pushes the fourth transistor 204d into deep cut-off region and protects it. When the voltage at the I/O pin 206 drops below $V_{DDM}$, the fourth transistor 204d is switched on and the voltage at the second node N2 begins to follow the voltage at the I/O pin 206, i.e. the voltage at the second node N2 becomes equal to the voltage at the I/O pin 206 less the threshold voltage of the fourth transistor 204d, $V_{T2}$. The second voltage detection circuit 202b provides ground potential ($V_{SS}$) at the gate terminal of the fifth transistor 204e when the voltage at the I/O pin 206 is greater than the voltage $V_{T2}$ and causes the fifth transistor 204e to switch off. When the voltage at the I/O pin 206 goes below the voltage $V_{T2}$, the second voltage detection circuit 202b starts providing the voltage $V_{DDM}$ to the gate terminal of the fifth transistor 204e. A detailed description of detection and generation of voltages of different magnitudes by the second voltage detection circuit 202b is provided below in conjunction with FIG. 3B. The voltage $V_{DDM}$ switches the fifth transistor 204e on and forms a current conducting path from ground ($V_{SS}$) to the I/O pin 206, thereby clamping the voltages at the I/O pin 206 and the second node N2 at ground potential. Thus, the I/O circuit is protected from damage due to less than ground value voltages.

Figure 3A:
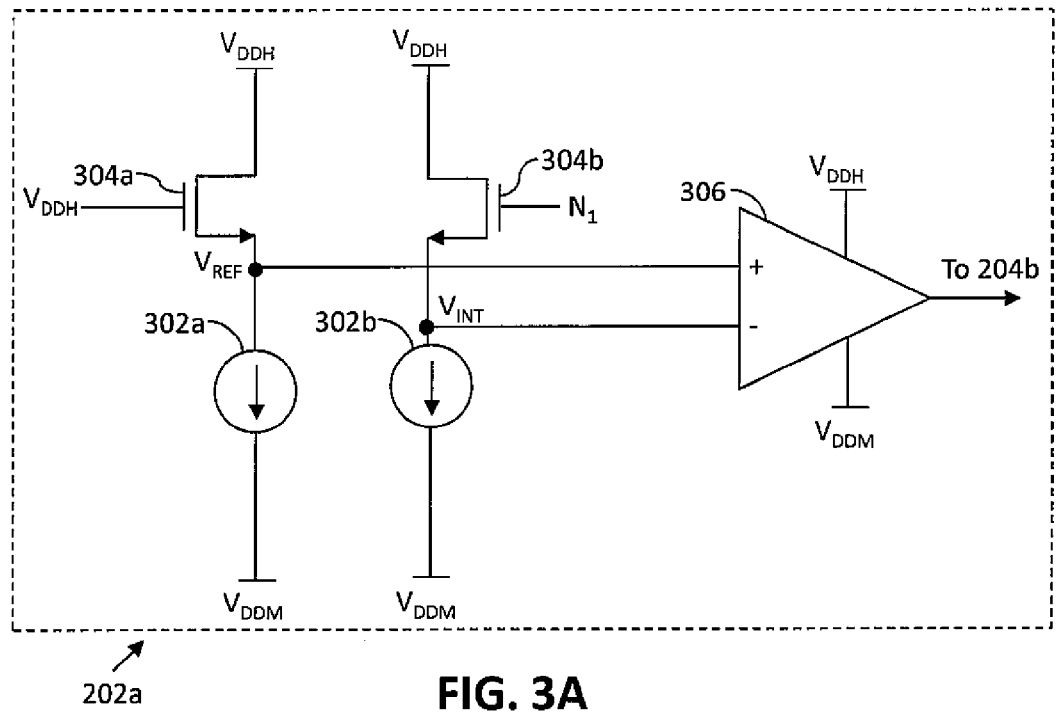
FIGS. 3A and 3B are detailed schematic diagrams of voltage detection circuits in accordance with an embodiment of the present invention.
Figure 3B:
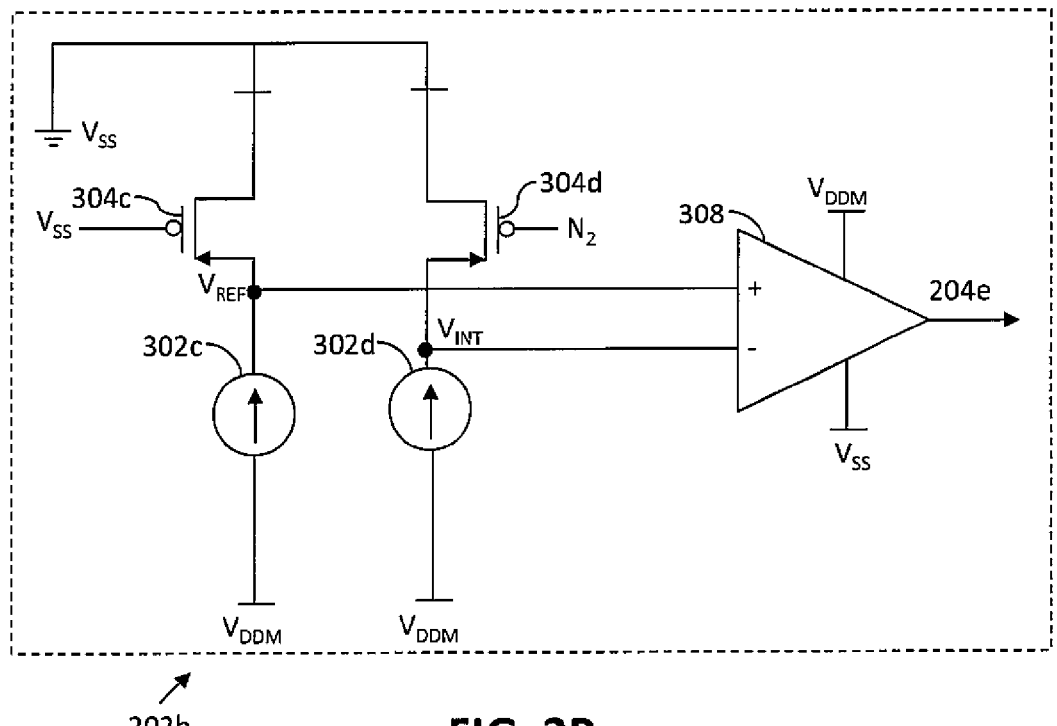

Referring now to FIGS. 3A and 3B, schematic diagrams of first and second voltage detection circuits 202a and 202b, respectively, in accordance with an embodiment of the present invention, are shown. The first voltage detection circuit 202a includes first and second current sources 302a and 302b, seventh and eighth transistors 304a and 304b, and a first comparator 306. The second voltage detection circuit 202b includes third and fourth current sources 302c and 302d, ninth and tenth transistors 304c and 304d, and a second comparator 308.

Drain terminals of the seventh and eighth transistors 304a and 304b, and the gate terminal of the seventh transistor 304a are provided with the supply voltage $V_{DDH}$. The gate terminal of the eighth transistor 304b is connected to the first node N1 (FIG. 2). The first and second current sources 302a and 302b are connected between the source terminals of the seventh and eighth transistors 304a and 304b, respectively, and the supply voltage $V_{DDM}$. The first and second current sources 302a and 302b generate currents $I_2$ and $I_2$, respectively, where $I_2>I_1$ by a predetermined value (for example 20%). The source terminals of the seventh and eighth transistors 304a and 304b are connected to positive and negative terminals, respectively, of the first comparator 306, and provide voltage $V_{REF1}$ and $V_{INT1}$ at the positive and negative terminals. The first comparator 306 also is provided with the supply voltages of $V_{DDH}$ and $V_{DDM}$. An output terminal of the first comparator 306 is connected to the gate terminal of the second transistor 204b (FIG. 2).

The seventh and eighth transistors 304a and 304b are connected in a source-follower configuration. As a result, voltages at the source terminals of the seventh and eighth transistors 304a and 304b, i.e. $V_{REF1}$ and $V_{INT1}$, respectively, follow the voltages at the gate terminals of the seventh and eighth transistors 304a and 304b. As long as the voltage at the gate terminal of the eighth transistor 304b is less than the supply voltage $V_{DDH}$, the voltage $V_{INT1}$ is less than the voltage $V_{REF1}$, which causes the first comparator 306 to output the voltage $V_{DDH}$. When the voltage at the gate terminal of the eighth transistor 304b exceeds the voltage $V_{DDH}$, then voltage $V_{INT1}$ exceeds voltage $V_{REF1}$, causing the first comparator 306 to trip and output the voltage $V_{DDM}$. As mentioned above, $I_2$ is greater than $I_2$ and a predetermined offset is maintained between the voltages $V_{DDH}$ and $V_{INT1}$ to ensure that the first comparator 306 does not trip when the voltage $V_{INT1}$ becomes equal to the voltage $V_{DDH}$. The first comparator 306 trips only when voltage $V_{INT1}$ is greater than voltage $V_{DDH}$. Additionally, the predetermined offset can be generated using different bias currents or different IR drops in the source-follower stages of the seventh and eighth transistors 304a and 304b. Thus, the first voltage detection circuit 202a outputs the voltage $V_{DDH}$ as long as the voltage at the first node N1 (which follows the voltage at the I/O pin 206) is less than the supply voltage $V_{DDH}$. The voltage detection circuit 202a outputs the voltage $V_{DDH}$ when the voltage at the node N1 is greater than the voltage $V_{DDH}$ and causes the second transistor 204b to switch on, thereby forming a current path from the I/O pin 206 to a supply voltage terminal (providing the voltage $V_{DDH}$) connected to the source terminal of the second transistor 204b. Thus, current flows from the I/O pin 206 to the supply and clamps the voltage at the I/O pin 206. In an embodiment of the invention, the seventh and eighth transistors 304a and 304b may comprise NPN bi-polar junction transistors (BJTs), or NMOS transistors.

Referring now to FIG. 3B, drain terminals of the ninth and tenth transistors 304c and 304d, and the gate terminal of the ninth transistor 304c are connected to ground ($V_{SS}$). The gate terminal of the tenth transistor 304d is connected to the second node N2 (FIG. 2). The third and fourth current sources 302c and 302d are connected to source terminals of the ninth and tenth transistors 304c and 304d, respectively, and the supply voltage terminal that provides the voltage $V_{DDM}$. The third and fourth current sources 302c and 302d generate third and fourth currents $I_3$ and $I_4$, respectively, where $I_4>I_3$ by a predetermined value. The source terminals of the ninth and tenth transistors 304c and 304d also are connected to positive and negative terminals of the second comparator 308, respectively, and provide respective voltages $V_{REF2}$ and $V_{INT2}$ to the second comparator. The second comparator 308 is provided with the supply voltages of $V_{DDM}$ and ground $V_{SS}$. An output terminal of the second comparator 308 is connected to the gate terminal of the fifth transistor 204e (FIG. 2).

The second voltage detection circuit 202b generates an output voltage based on a voltage at the gate terminal of the tenth transistor 304d in a similar fashion as that of the first voltage detection circuit 202a (described above). Thus, the second voltage detection circuit 202b outputs ground potential $V_{SS}$ as long as the voltage at the second node N2 (which follows the voltage at the I/O pin 206) is greater than 0V. The second voltage detection circuit 202b outputs voltage $V_{DDM}$ when the voltage at the node N2 is less than 0V. As the fourth current $I_4$ is greater than the third current $I_3$, a predetermined offset is maintained between the ground potential V, and the voltage $V_{INT2}$ to ensure that the second comparator 308 does not trip when $V_{INT2}=V_{ss}$. The second comparator 308 trips only when the voltage $V_{INT2}$ drops below the ground potential $V_{ss}$. This predetermined offset can be inserted using different bias currents or using different IR drops in the source-follower stages of the ninth and tenth transistors 304c and 304d. This switches on the fifth transistor and forms a current path from ground to the source terminal of the fifth transistor 204e and subsequently to the I/O pin 206. Thus, current flows from ground to the I/O pin 206 and clamps the voltage at the I/O pin 206. In an embodiment of the invention, the ninth and tenth transistors 304c and 304d comprise PNP BJTs or PMOS transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A voltage clamping circuit for an input/output (I/O) pin of an integrated circuit, the voltage clamping circuit comprising:
   a first transistor having a drain terminal connected to the I/O pin and a gate terminal that receives a first voltage, wherein the first transistor generates a first intermediate signal based on an input signal provided at the I/O pin when a magnitude of the input signal exceeds a predetermined threshold;
   a voltage detection circuit, connected to a source terminal of the first transistor, for detecting a voltage thereon and generating a second intermediate signal having a magnitude equal to at least one of the first voltage and a second voltage;
   a second transistor having a gate terminal connected to the voltage detection circuit, a drain terminal connected to the source terminal of the first transistor, and a source terminal that receives the second voltage, wherein the second transistor generates a third intermediate signal based on the first and second intermediate signals; and
   a third transistor having a drain terminal that receives the first voltage, a source terminal connected to a node between the source and drain terminals of the first and second transistors, respectively, and a gate terminal connected to the I/O pin, wherein the third transistor provides the first voltage to the node during a nominal operation of the I/O pin.

2. The voltage clamping circuit of claim 1, wherein the voltage detection circuit comprises:
   a fourth transistor having a source terminal that receives the first voltage and conducts a first current, and drain and gate terminals that receive the second voltage, wherein the fourth transistor generates a reference voltage signal;
   a fifth transistor having a source terminal that receives the first voltage and conducts a second current that is greater than the first current by a predetermined value, a drain terminal that receives the second voltage, and a gate terminal connected to the source terminal of the first transistor at the node, for receiving the voltage thereon, wherein the fifth transistor generates an internal voltage signal; and
   a differential comparator having positive and negative terminals connected to the source terminals of the fourth and fifth transistors respectively, for generating the second intermediate signal based on the reference voltage signal and the internal voltage signal.

3. The voltage clamping circuit of claim 2, wherein the fourth and fifth transistors are at least one of NPN bi-polar junction transistors (BJTs) and n-channel metal-oxide semiconductor (NMOS) transistors when the voltage clamping circuit is used to protect the I/O pin from overshoot voltages.

4. The voltage clamping circuit of claim 2, wherein the fourth and fifth transistors are at least one of PNP BJTs and p-channel metal-oxide semiconductor (PMOS) transistors when the voltage clamping circuit is used to protect the I/O pin from undershoot voltages.

5. The voltage clamping circuit of claim 1, wherein the first voltage is less than the second voltage when the voltage clamping circuit is used to protect the I/O pin from overshoot voltages.

6. The voltage clamping circuit of claim 1, wherein the first, second, and third transistors are at least one of PNP BJTs and PMOS transistors when the voltage clamping circuit is used to protect the I/O pin from overshoot voltages.

7. The voltage clamping circuit of claim 1, wherein the first voltage is greater than the second voltage when the voltage clamping circuit is used to protect the I/O pin from undershoot voltages.

8. The voltage clamping circuit of claim 1, wherein the second voltage is shorted to ground when the voltage clamping circuit is used to protect the I/O pin from undershoot voltages.

9. The voltage clamping circuit of claim 1, wherein the first, second, and third transistors are at least one of NPN BJTs and NMOS transistors when the voltage clamping circuit is used to protect the I/O pin from undershoot voltages.

10. The voltage clamping circuit of claim 1, wherein the predetermined threshold is equal to a sum of the first voltage and a threshold voltage of the first transistor.

11. A voltage clamping circuit for an input/output (I/O) pin of an integrated circuit, comprising:
    a first transistor having a drain terminal connected to the I/O pin and a gate terminal that receives a first voltage, wherein the first transistor generates a first intermediate signal based on an input signal provided at the I/O pin when a magnitude of the input signal exceeds a predetermined threshold;
    a first voltage detection circuit, connected to a source terminal of the first transistor, for detecting a voltage thereon, wherein the first voltage detection circuit comprises:
       a second transistor having a source terminal that receives the first voltage and conducts a first current, and drain and gate terminals that receive a second voltage, wherein the fourth transistor generates a first reference voltage signal;
       a third transistor having a source terminal that receives the first voltage and conducts a second current that is greater than the first current by a predetermined value, a drain terminal that receives the second voltage, and a gate terminal connected to the source terminal of the first transistor for receiving the voltage thereon, wherein the third transistor generates a first internal voltage signal; and
       a first differential comparator having positive and negative terminals connected to the source terminals of the second and third transistors respectively, for generating a second intermediate signal based on the first reference voltage signal and the first internal voltage signal;
    a fourth transistor having a gate terminal connected to the differential comparator for receiving the second intermediate signal, a drain terminal connected to the source terminal of the first transistor at a first node, and a source terminal that receives the second voltage, wherein the fourth transistor generates a third intermediate signal based on the first and second intermediate signals; and
    a fifth transistor having a drain terminal that receives the first voltage, a source terminal connected to the first node, and a gate terminal connected to the I/O pin, wherein the fifth transistor provides the first voltage to the node during a nominal operation of the I/O pin.

12. The voltage clamping circuit of claim 11, wherein the first voltage is less than the second voltage when the voltage clamping circuit is used to protect the I/O pin from overshoot voltages.

13. The voltage clamping circuit of claim 11, wherein the first, fourth, and fifth transistors are at least one of PNP bi-polar junction transistors (BJTs) and p-channel metal-oxide semiconductor (PMOS) transistors when the voltage clamping circuit is used to protect the I/O pin from overshoot voltages.

14. The voltage clamping circuit of claim 11, wherein the second and third transistors are at least one of NPN BJTs and re-channel metal-oxide semiconductor (NMOS) transistors when the voltage clamping circuit is used to protect the I/O pin from overshoot voltages.

15. The voltage clamping circuit of claim 11, wherein the first voltage is greater than the second voltage when the voltage clamping circuit is used to protect the I/O pin from undershoot voltages.

16. The voltage clamping circuit of claim 11, wherein the second voltage is connected to ground when the voltage clamping circuit is used to protect the I/O pin from undershoot voltages.

17. The voltage clamping circuit of claim 11, wherein the first, fourth, and fifth transistors are at least one of NPN BJTs and NMOS transistors when the voltage clamping circuit is used to protect the I/O pin from undershoot voltages.

18. The voltage clamping circuit of claim 11, wherein the second and third transistors are at least one of PNP BJTs and PMOS transistors when the voltage clamping circuit is used to protect the I/O pin from undershoot voltages.

19. The voltage clamping circuit of claim 11, wherein the predetermined threshold is equal to a sum of the first voltage and a threshold voltage of the first transistor.

20. A voltage clamping circuit for an input/output (I/O) pin of an integrated circuit, comprising:
- a first transistor having a drain terminal connected to the I/O pin and a gate terminal that receives a first voltage, wherein the first transistor generates a first intermediate signal based on an input signal provided at the I/O pin, when a magnitude of the input signal exceeds a first predetermined threshold;
- a first voltage detection circuit, connected to a source terminal of the first transistor, for detecting a voltage thereon and generating a second intermediate signal having a magnitude equal to at least one of the first voltage and a second voltage;
- a second transistor having a gate terminal connected to the voltage detection circuit, a drain terminal connected to the source terminal of the first transistor, and a source terminal that receives the second voltage, wherein the second transistor generates a third intermediate signal based on the first and second intermediate signals;
- a third transistor having a drain terminal that receives the first voltage, a source terminal connected to a node between the source and drain terminals of the first and second transistors, respectively, and a gate terminal connected to the I/O pin, wherein the third transistor provides the first voltage to the node, during a nominal operation of the I/O pin;
- a fourth transistor having a drain terminal connected to the I/O pin and a gate terminal that receives the first voltage, wherein the fourth transistor generates a fourth intermediate signal based on the input signal provided at the I/O pin, when the magnitude of the input signal reduces below a second predetermined threshold;
- a second voltage detection circuit, connected to a source terminal of the fourth transistor, for detecting a voltage thereon and generating a fifth intermediate signal having a magnitude equal to at least one of the first voltage and a ground potential;
- a fifth transistor having a gate terminal connected to the second voltage detection circuit, a drain terminal connected to the source terminal of the fourth transistor, and a source terminal that receives the ground potential, wherein the fifth transistor generates a sixth intermediate signal based on the fourth and fifth intermediate signals; and
- a sixth transistor having a drain terminal that receives the first voltage, a source terminal connected to a node between the source and drain terminals of the fourth and fifth transistors, respectively, and a gate terminal connected to the I/O pin, wherein the sixth transistor provides the first voltage to the node, during a nominal operation of the I/O pin.

* * * * *